US005389796A

United States Patent [19]

Kang et al.

[11] Patent Number: 5,389,796

[45] Date of Patent: Feb. 14, 1995

[54] VACUUM TRANSISTOR HAVING AN OPTICAL GATE

[75] Inventors: Sung-Weon Kang; Jin-Yeong Kang, both of Daejeon, Rep. of Korea

[73] Assignee: Electronics and Telecommunications Research Institute, Rep. of Korea

[21] Appl. No.: 171,408

[22] Filed: Dec. 22, 1993

[30] Foreign Application Priority Data

Dec. 22, 1992 [KR] Rep. of Korea .................... 92-25030

[51] Int. Cl.[6] .............................................. H01L 29/06

[52] U.S. Cl. ...................................... 257/10; 257/622; 313/306; 313/309; 313/336

[58] Field of Search .................... 257/10, 11, 618, 622, 257/773; 313/302, 303, 306, 307, 309, 310, 346 R, 373, 383, 336, 351, 355

[56] References Cited

U.S. PATENT DOCUMENTS

| | | | |
|---|---|---|---|
| 4,303,930 | 12/1981 | Van Gorkum et al. | 257/10 |
| 5,202,571 | 4/1993 | Hirabayashi et al. | 257/10 |
| 5,204,581 | 4/1993 | Andreadakis et al. | 313/309 X |
| 5,245,247 | 9/1993 | Hosogi | 313/306 X |
| 5,245,248 | 9/1993 | Chan et al. | 313/309 |
| 5,247,223 | 9/1993 | Mori et al. | 313/336 X |

FOREIGN PATENT DOCUMENTS

| | | | |
|---|---|---|---|
| 0411784 | 1/1992 | Japan | 257/11 |

*Primary Examiner*—William Mintel

*Attorney, Agent, or Firm*—Evenson, McKeown, Edwards & Lenahan

[57] ABSTRACT

A vacuum transistor having an optical gate in which an optical signal is radiated from the optical gate. The transistor has a silicon substrate; an insulating layer deposited on said silicon substrate, the insulating layer having a recess portion formed by an etching method; an optical source for radiating the optical signal and serving as said optical gate; and two electrodes formed on said insulating layer and separated from each other under a vacuum or an atmosphere. One of the electrodes receives the optical signal and is an electron emitting electrode for emitting electrons, and the other electrode is an electron collecting electrode for collecting the electrons emitted from said electron emitting electrode. The electron emitting electrode is formed beneath said optical source under a vacuum or an atmosphere and is connected to ground; and said electron collecting electrode is connected to a power source. The amount of current flowing in said electron collecting electrode may be adjusted by the intensity of the optical signal from said optical source. The mobility of electrons between the electron emitting electrode and the electron collecting electrode is further improved owing to a vacuum state or an atmosphere state of the electron transferring path.

3 Claims, 4 Drawing Sheets

VACUUM TRANSISTOR HAVING AN OPTICAL GATE

BACKGROUND OF THE INVENTION

1. Field of the Invention

The present invention relates to a vacuum transistor having an optical gate and a method for manufacturing the same, and more particularly to a vacuum transistor in which an electric field is applied to two adjacent electrodes under a vacuum state or an atmosphere state and photons having a threshold energy or more are radiated from an optical gate to one of the electrodes so as to emit electrons therefrom and a manufacturing method of the vacuum transistor with an optical gate.

2. Description of the Prior Art

Recently, electric devices have further developed in accordance with the development of solid semiconductor physics, and in such electric devices enhancement of high speed, high integration, high reliability or the like is more continuously required.

The continued development of such an electric device has been limited by minutely working techniques, and therefore there arise various obstacles in manufacturing of this electric device.

Particularly, in fabrication of solid state electric devices the mobility of respective electrons flowing in the respective devices becomes a significant physical factor determining electrical characteristics of such semiconductor devices, electric materials and the like, because transference of the respective electrons is determined by a scattering phenomenon as is well-known in this art.

When a silicon substrate is utilized in fabrication of such transistors, mobility of electric charges in the silicon substrate is determined previously and therefore the performance of the respective transistors is also determined.

FIG. 1 is a sectional view showing the construction of a conventional MOS (metal oxide semiconductor) transistor using a silicon substrate. In FIG. 1, reference numeral 5 represents a silicon substrate, 2 and 3 represent source and drain regions, respectively, and 1 represents a gate electrode formed on the substrate 5 between the regions 2 and 3. Between the gate electrode 1 and the substrate 5 is formed a gate insulating layer 4.

In the operation of such a conventional MOS transistor, the silicon substrate 5 serves only as support means, and the transferring of electrons is substantially carried out in the gate electrode 1 and in a channel region of the substrate 5 which is formed beneath the gate insulating layer 4.

To overcome those limits with respect to mobility of electrons in the solid state channel region of the transistor as shown in FIG. 1, it is required that electrons are transferred in a vacuum state or an atmosphere state channel of such a transistor without reference to the above-mentioned scattering and the mobility of electrons therein is determined only by an externally applied electrical field, thereby obtaining characteristics of a high-speed operation.

SUMMARY OF THE INVENTION

It is an object of the present invention to provide a vacuum transistor having an optical gate and a method for manufacturing the same, in which transferring of electrons is carried out in vacuum or atmosphere region and controlled only by an externally applied electrical-field, so as to improve the mobility of electrons therein.

To achieve the above-mentioned object, the vacuum transistor having an optical gate according to one aspect of the present invention comprises a silicon substrate; an insulating layer is deposited on said silicon substrate, the insulating layer having a recess portion formed by an etching method; an optical source for radiating the optical signal serves as said optical gate; two electrodes are formed on said insulating layer and are separated from each other under a vacuum or an atmosphere. One of these electrodes receives the optical signal and is an electron emitting electrode for emitting electrons, and the other electrode is an electron collecting electrode for collecting the electrons emitted from said electron emitting electrode. The electron emitting electrode is formed beneath said optical source under a vacuum or an atmosphere and connected to ground. The electron collecting electrode is connected to a power source, wherein the amount of current flowing in said electron collecting electrode is adjusted by the intensity of the optical signal from said optical source.

In the construction of the present invention, each of the opposite ends of said electrodes are separated by the recess portion and have a tip-shaped structure and are isolated electrically from each other, and said optical source is made of one of a laser and a light emitting diode.

Furthermore, the present invention method for manufacturing a vacuum transistor having an optical gate, in which an optical signal is radiated from an optical gate, comprises the steps of: preparing a silicon substrate; forming an insulating layer on said silicon substrate; forming an electrode pattern on said insulating layer to form an electron emitting electrode as a source electrode and an electron collecting electrode as a drain electrode; etching said insulating layer between said electron emitting and collecting electrodes to form a recess portion in said insulating layer and to spatially isolate said source and drain electrodes by the recess portion; and forming an optical source over said electron emitting electrode only, said optical source serving as said optical gate.

BRIEF DESCRIPTION OF THE DRAWINGS

This invention may be better understood and its objects and advantages will become apparent to those skilled in the art by reference to the/accompanying drawings as follows.

DESCRIPTION OF THE PREFERRED EMBODIMENT(S)

It will be described hereinafter that electrons are transferred through a vacuum or an atmosphere region, utilizing the principle of the photoelectric effect as proposed by Einstein.

Figure 1:
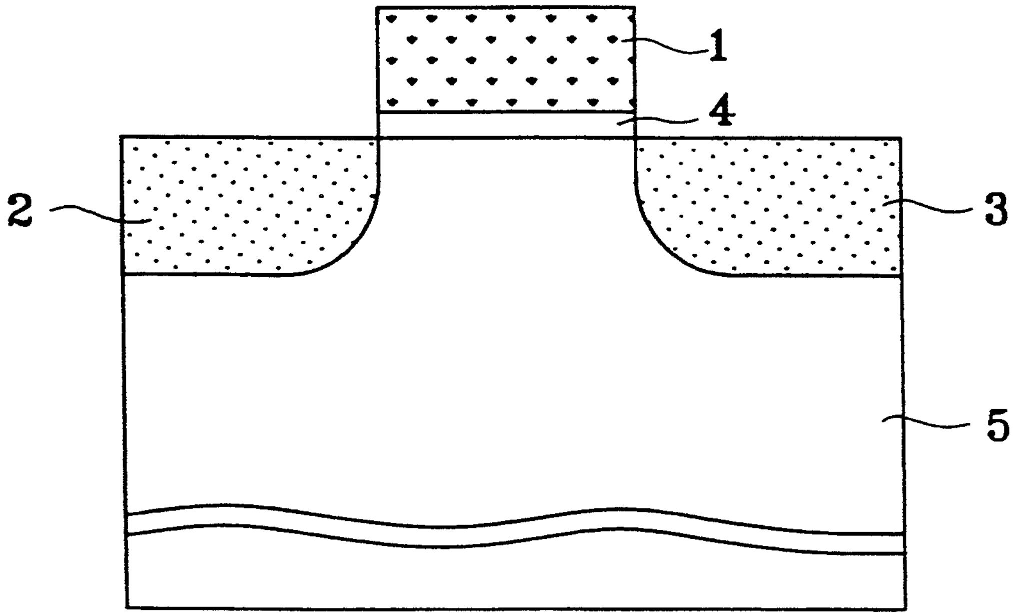
Fig. 1 (PRIOR ART)
FIG. 1 is a sectional view of a conventional MOS transistor (metal oxide/semiconductor transistor)
Figure 2:
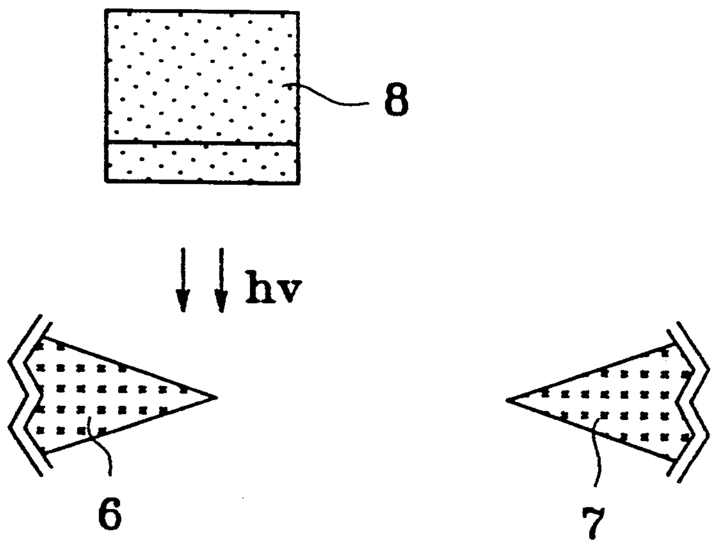
FIG. 2 is a schematic diagram showing that electrons are transferred through a vacuum or an atmosphere region, utilizing the principle of the photoelectric effect to be used in the present invention.

As shown in FIG. 2, under a vacuum state or an atmosphere state a first conductive electrode 6 serving as an electron emitting electrode is isolated spatially from a second conductive electrode 7 serving as an electron collecting electrode, and an optical source 8 serving as an optical signal radiating electrode is formed over the first conductive electrode 6. In the illustrated embodiment, when the optical signal having a threshold energy or more is radiated from the optical source 8 to a surface of the first conductive electrode 6, electrons are emitted from the surface of the first conductive electrode 6 and provided to the second conductive electrode 7. Then the second conductive electrode 7 collects the emitted electrons.

Referring now to FIGS. 3A to 3D, manufacturing steps of the vacuum transistor provided with an optical gate in accordance with an example of the present invention will be explained hereinafter.

Figure 3A:
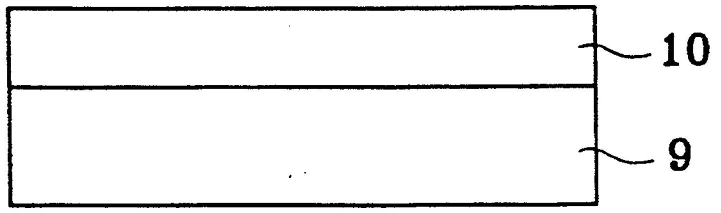
FIGS. 3A to 3D are sectional views showing the manufacturing steps of the transistor with an optical gate according to the present invention.
Figure 3B:
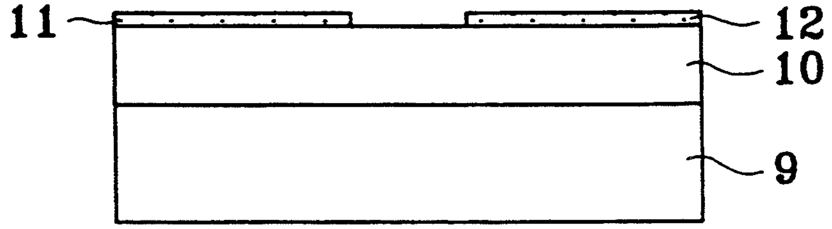

As shown in FIG. 3A, on the main surface of a silicon substrate 9 is formed an insulating layer 10. Subsequently, on the insulating layer 9 is formed an electrode pattern which is defined by an electron emitting electrode 11 (hereinafter, referred to as "an emission electrode") and an electron collecting electrode 12 (hereinafter, referred to as "a collector electrode"). Those electrodes 11 and 12 are each made of a poly-crystal silicon, a metal, a metal class or the like.

Figure 3C:
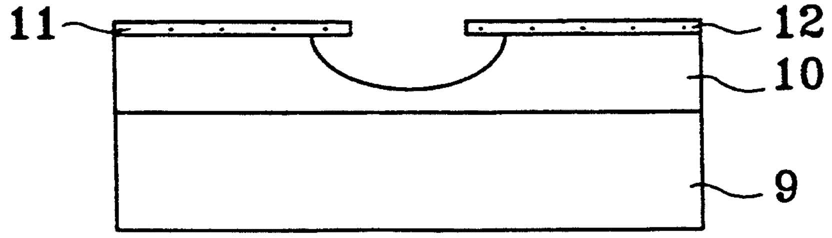

With respect to FIG. 3C, a portion of the insulating layer 10 between the electrodes 11 and 12 is removed by a wet etching method or a dry etching method, as well-known in the art, and thus each of the electrodes 11 and 12 has a tip-shaped structure caused by the etched recess portion therebetween, where the tip-shaped structure means that opposite ends of the electrodes 11 and 12 are pointed by the recess portion. For example, in the insulating layer 10 the recess portion is formed when the insulating layer 10 is removed by the etching method, and the opposite ends of the electrodes 11 and 12 are spatially isolated by the recess portion from each other.

Figure 3D:
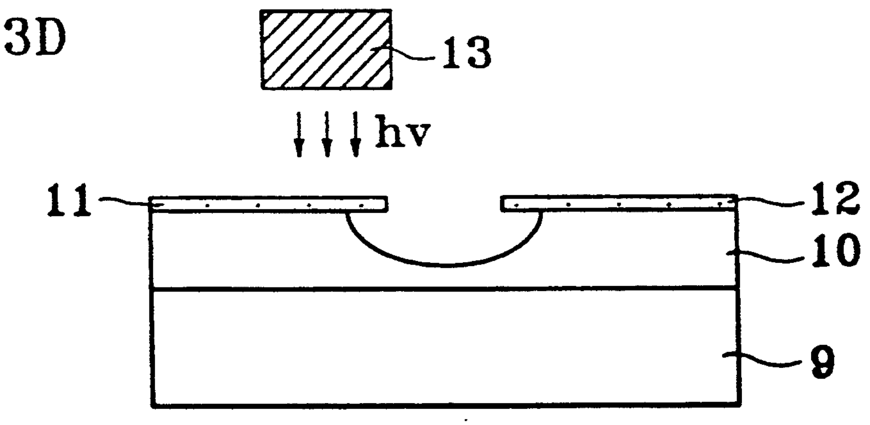

In FIG. 3D, an optical source 13 is formed over the emission electrode 11 under a vacuum state or an atmosphere state. This optical source 13 functions as an optical gate for radiating an optical signal, and is made of a laser or a light emitting device such as a light emitting diode, so as to provide the irradiated optical signal to an upper surface of the emission electrode 11 through a vacuum region or an atmosphere region.

Figure 4:
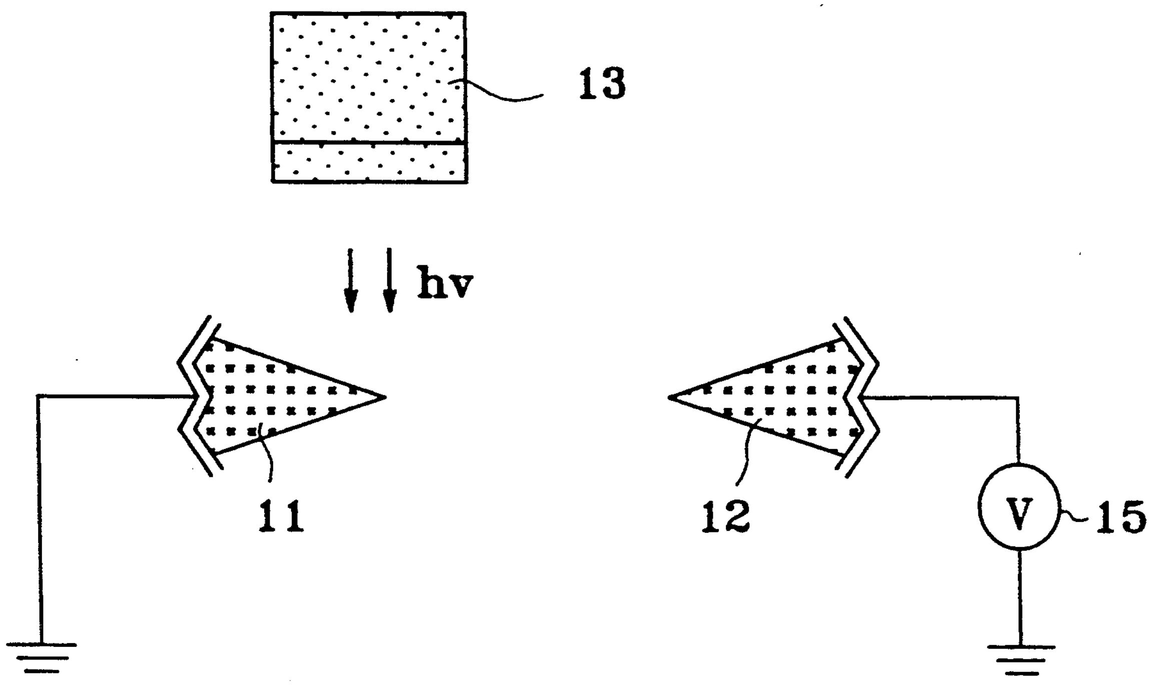
FIG. 4 is a schematic diagram showing a basic circuit in which the vacuum transistor of the present invention is embodied.

FIG. 4 is a schematic diagram for explaining a basic circuit having the vacuum transistor with an optical gate, in which the emission electrode 11 is grounded and the collector electrode 12 is connected to a power source as a driving source, so as to provide a predetermined electrical field between the electrodes 11 and 12.

With respect to FIG. 4, when an optical signal is generated from the optical gate 13 to the emission electrode 11, electrons are emitted from the upper surface of the emission electrode 11 by the principle of the photoelectric effect and introduced to the collector electrode 12. Then, current flows between the emission electrode 11 and the collector electrode 12. Here, the amount of current flowing in the collector electrode 12 is determined and adjusted by variation of the intensity of the radiated optical signal.

As described above, the vacuum transistor provided with an optical gate according to the present invention has a characteristic of a high-speed operation, because the operating speed of the vacuum transistor is determined by the driving speed of the optical gate therein. The reason why the vacuum transistor may be operated at a higher speed, as compared with a conventional solid state semiconductor device, is that mobility of electrons between the electron emitting electrode and the electron collecting electrode is further improved owing to the electron transferring path under a vacuum state or an atmosphere state. Also, the vacuum transistor has amplitude characteristics such that the amount of current flow therein can be changed by variation of the intensity of the optical signal as radiated from the optical gate. Furthermore, the vacuum transistor having the above-mentioned characteristics may be applied to a base element for optical logic-circuits.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A vacuum transistor having an optical gate, in which an optical signal is radiated from the optical gate, the transistor comprising a silicon substrate;

an insulating layer deposited on said silicon substrate, the insulating layer having a recess portion formed by an etching method;

an optical source for radiating the optical signal and serving as said optical gate;

two electrodes formed on said insulating layer and separated from each other under a vacuum or an atmosphere, one of which receives the optical signal and is an electron emitting electrode for emitting electrons, and the other of which is an electron collecting electrode for collecting the electrons emitted from said electron emitting electrode;

said electron emitting electrode formed beneath said optical source under a vacuum or an atmosphere and connected to ground; and said electron collecting electrode connected to a power source, wherein an amount of current flowing in said electron collecting electrode is adjusted by an intensity of the optical signal from said optical source.

2. The transistor according to claim 1, wherein each of opposite ends of said electrodes are separated by the recess portion and have a tip-shaped structure and are isolated electrically from each other.

3. The transistor according to claim 1, wherein said optical source is made of one of a laser and a light emitting diode.

* * * * *